US009627596B2

(12) United States Patent
Hong et al.

(10) Patent No.: US 9,627,596 B2
(45) Date of Patent: Apr. 18, 2017

(54) LIGHT EMITTING DEVICE, LIGHT EMITTING DEVICE PACKAGE INCLUDING THE DEVICE AND LIGHTING APPARATUS INCLUDING THE PACKAGE

(71) Applicant: LG INNOTEK CO., LTD., Seoul (KR)

(72) Inventors: Eun Ju Hong, Seoul (KR); Jung Hun Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 226 days.

(21) Appl. No.: 14/509,195

(22) Filed: Oct. 8, 2014

(65) Prior Publication Data
US 2015/0098224 A1 Apr. 9, 2015

(30) Foreign Application Priority Data

Oct. 8, 2013 (KR) .................. 10-2013-0119754

(51) Int. Cl.
*F21S 6/00* (2006.01)
*H01L 33/62* (2010.01)
(Continued)

(52) U.S. Cl.
CPC .............. *H01L 33/62* (2013.01); *F21K 9/00* (2013.01); *F21V 3/049* (2013.01); *F21V 3/0472* (2013.01);
(Continued)

(58) Field of Classification Search
CPC ......... H01L 33/62; H01L 33/08; H01L 24/14; H01L 33/20; H01L 33/38;
(Continued)

(56) References Cited

U.S. PATENT DOCUMENTS 5,046,161 A * 9/1991 Takada ................... H01L 24/10
257/642
7,659,546 B2 * 2/2010 Lu ........................... H01L 33/62
257/100
(Continued)

FOREIGN PATENT DOCUMENTS

JP 2007-324577 A 12/2007

OTHER PUBLICATIONS

European Search Report issued in Application No. 14188064.1 dated Feb. 27, 2015.

*Primary Examiner* — Anh Mai
*Assistant Examiner* — Glenn Zimmerman
(74) *Attorney, Agent, or Firm* — KED & Associates, LLP

(57) ABSTRACT

Embodiments provide a light emitting device including a substrate, a light emitting structure disposed under the substrate, the light emitting structure including a first conductive semiconductor layer, an active layer and a second conductive semiconductor layer, a sub-mount, first and second metal pads disposed on the sub-mount and electrically spaced apart from one another, a one first bump disposed between the first conductive semiconductor layer and the first metal pad and a second bump located between the second conductive semiconductor layer and the second metal pad. A plurality of active areas in which The first semiconductor layer and the active layer are disposed are spaced apart from one another when viewed in plan.

20 Claims, 18 Drawing Sheets

(51) Int. Cl.
*F21V 3/04* (2006.01)
*F21K 9/00* (2016.01)
*F21V 8/00* (2006.01)
*H01L 33/08* (2010.01)
*H01L 23/00* (2006.01)
*F21Y 105/00* (2016.01)
*H01L 33/20* (2010.01)
*H01L 33/38* (2010.01)
*F21Y 101/00* (2016.01)

(52) U.S. Cl.
CPC ............ *G02B 6/0011* (2013.01); *H01L 24/14* (2013.01); *H01L 33/08* (2013.01); *F21Y 2101/00* (2013.01); *F21Y 2105/00* (2013.01); *H01L 33/20* (2013.01); *H01L 33/38* (2013.01); *H01L 2224/16145* (2013.01); *H01L 2224/48091* (2013.01); *H01L 2224/73265* (2013.01); *H01L 2924/12041* (2013.01); *H01L 2924/12042* (2013.01); *H01L 2924/181* (2013.01)

(58) Field of Classification Search
CPC . H01L 2224/16145; H01L 2224/48091; H01L 2224/73265; H01L 2924/181; H01L 2924/12042; H01L 2924/12; H01L 2924/12041; F21V 3/0472; F21V 3/049; F21K 9/00; G02B 6/0011; F21Y 2101/02; F21Y 2105/00; F21Y 2101/00
USPC .............. 362/257, 84, 800; 313/503; 257/99
See application file for complete search history.

(56) References Cited

U.S. PATENT DOCUMENTS

| | | | |
|---|---|---|---|
| 2004/0160173 A1 | 8/2004 | Shen et al. ..................... 313/506 |
| 2004/0182914 A1* | 9/2004 | Venugopalan .......... H01L 33/40 228/215 |
| 2005/0156177 A1 | 7/2005 | Lin et al. |
| 2005/0264172 A1* | 12/2005 | Wojnarowski .......... H01L 33/08 313/498 |
| 2006/0231852 A1 | 10/2006 | Kususe et al. |
| 2007/0012939 A1 | 1/2007 | Hwang et al. |
| 2007/0045761 A1* | 3/2007 | Basin ...................... H01L 24/97 257/440 |
| 2007/0247855 A1* | 10/2007 | Yano ..................... H01L 33/641 362/294 |
| 2009/0267085 A1* | 10/2009 | Lee ........................... F21K 9/00 257/88 |
| 2011/0062454 A1* | 3/2011 | Wan ....................... H01L 33/56 257/88 |
| 2013/0248895 A1* | 9/2013 | Saito ................... H01L 25/0753 257/88 |
| 2013/0307001 A1* | 11/2013 | Lee ........................ H01L 33/12 257/94 |
| 2014/0361243 A1* | 12/2014 | Choi ..................... H01L 33/405 257/13 |
| 2014/0374784 A1* | 12/2014 | Kim ................... H01L 33/0025 257/94 |
| 2015/0069430 A1* | 3/2015 | Collins ................... H01L 33/50 257/89 |

\* cited by examiner

TEMPERATURE → high

TEMPERATURE            high

TEMPERATURE → high

LIGHT EMITTING DEVICE, LIGHT EMITTING DEVICE PACKAGE INCLUDING THE DEVICE AND LIGHTING APPARATUS INCLUDING THE PACKAGE

CROSS REFERENCE TO RELATED APPLICATION

This application claims priority under 35 U.S.C §119 to Korean Patent Application No. 10-2013-0119754, filed in Korea on 8 Oct. 2013, which is hereby incorporated in its entirety by reference as if fully set forth herein.

TECHNICAL FIELD

Embodiments relate to light emitting device, light emitting device package including the device and lighting apparatus including the package.

BACKGROUND

Light Emitting Diodes (LEDs) are semiconductor devices that convert electricity into infrared light or the like using properties of compound semiconductors to enable transmission/reception of signals, or that are used as light sources.

Group III-V nitride semiconductors are in the spotlight as core materials of light emitting devices, such as LEDs or Laser Diodes (LDs), due to physical and chemical properties thereof.

Such LEDs do not contain environmentally harmful materials, such as mercury (Hg), used in conventional lighting apparatuses, such as incandescent bulbs, fluorescent lamps, etc., and are eco-friendly and, moreover, have several advantages including low power consumption, semi-permanent lifespan and the like. As such, conventional light sources are being rapidly replaced with LEDs.

FIGS. 1A and 1B are plan views showing conventional light emitting devices.

The conventional light emitting device as exemplarily shown in FIG. 1A consists of an n-type semiconductor layer 10, active areas 20, p-type bumps 30-1, 30-2 and 30-3 and an n-type bump 40. The conventional light emitting device as exemplarily shown in FIG. 1B consists of an n-type semiconductor layer 10, active areas 22, p-type bumps 30-1 to 30-5 and n-type bumps 40-1 to 40-4.

Referring to FIGS. 1A and 1B, in these conventional light emitting devices, the active areas 20 or 22 are disposed in contact with each other rather than being spaced apart from each other. In this case, overlapping portions 50 to 60 of the active areas 20 or 22 exhibit deteriorated heat radiation.

SUMMARY

Embodiments provide light emitting device, light emitting device package including the device and lighting apparatus including the package, which achieve good heat radiation and improved luminous efficacy.

In one embodiment, a light emitting device includes a substrate, a light emitting structure disposed under the substrate, the light emitting structure including a first conductive semiconductor layer, an active layer, and a second conductive semiconductor layer, a sub-mount, first and second metal pads disposed on the sub-mount and electrically spaced apart from one another, at least one first bump disposed between the first conductive semiconductor layer and the first metal pad and at least one second bump located between the second conductive semiconductor layer and the second metal pad, wherein a plurality of active areas in which the first semiconductor layer and the active layer are disposed are spaced apart from one another when viewed in plan.

The active areas may be spaced apart from one another by a distance within a range of 60 μm to 300 μm.

The active areas may be spaced apart from edges of the light emitting device by a distance within a range of 10 μm to 100 μm.

The active areas may be spaced apart from edges of the light emitting device by the same distance or different distances.

The second bump may be disposed between the active areas when viewed in plan.

The at least one second bump may include a plurality of second bumps, and the second bumps may be disposed in a cross shape or in a triangular shape when viewed in plan.

The first bump may have a circular plan shape and the second bump may have a circular plan shape.

The light emitting device may further include a reflective layer disposed between the second bump and the second conductive semiconductor layer.

The light emitting device may further include a reflective layer having an annular plan shape to surround the active areas.

The active areas may be equidistantly spaced apart from one another or may be spaced apart from one another by different distances when viewed in plan.

The active areas may be disposed on the periphery of the light emitting device when viewed in plan.

The light emitting device may have a polygonal plan shape. The active areas may be disposed near corners of and/or at a center of the polygonal light emitting device.

The active layer may be configured to emit light having a wavelength range of 100 nm to 280 nm.

In accordance with another embodiment, a light emitting device package includes a header, a sidewall disposed on the header to define a cavity, first and second wires respectively electrically connected to the first and second metal pads of the light emitting device according to any one of claims 1 to 18, the light emitting device being disposed in the cavity on the header, first and second lead wires electrically connected to the first and second metal pads via the first and second wires, respectively and a molding member formed to fill the cavity so as to enclose the light emitting device.

In accordance with a further embodiment, a lighting apparatus includes the light emitting device package according to claim 19 and a cover configured to diffuse, scatter or excite light emitted from the light emitting device package.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1A:
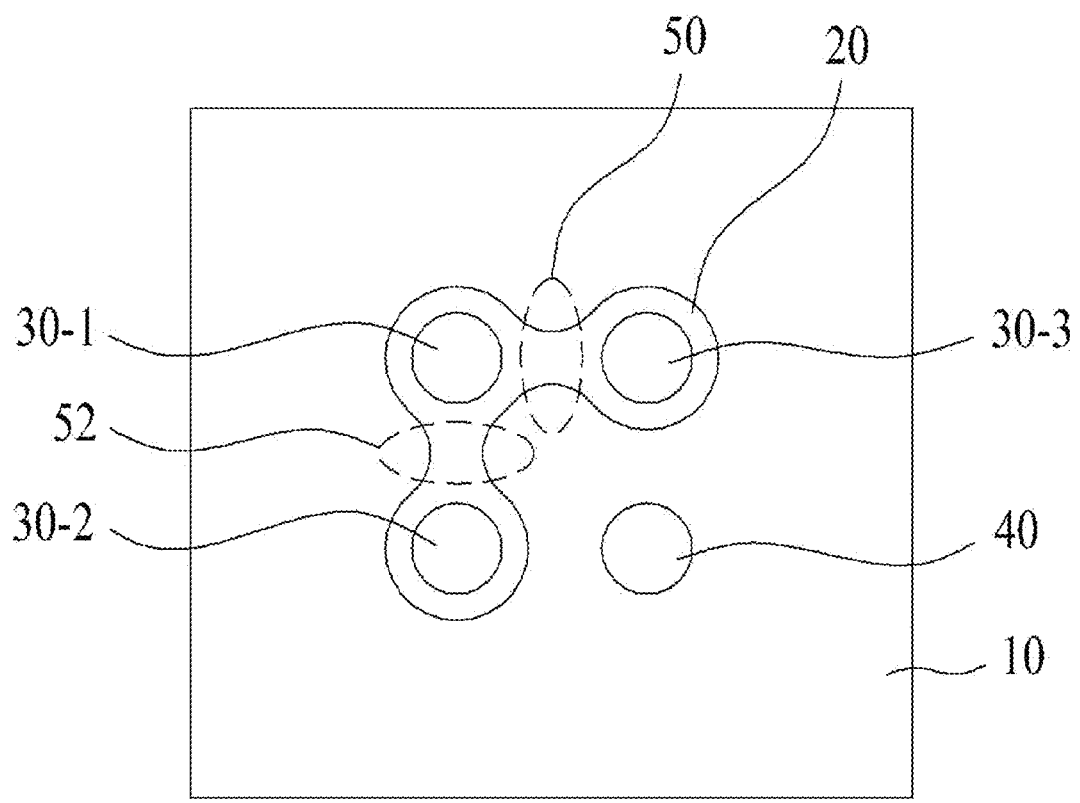
FIGS. 1A and 1B are plan views showing conventional light emitting devices.

Hereinafter, exemplary embodiments will be described in detail with reference to the accompanying drawings to aid in understanding of the embodiments. However, the embodiments may be altered in various ways, and the scope of the embodiments should not be construed as limited to the following description. The embodiments are intended to provide those skilled in the art with more complete explanation.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

In addition, the relative terms "first" "second" "upper", "lower" "fourth," and the like in the description and in the claims may be used to distinguish between any one substance or element and other substances or elements and not necessarily for describing any physical or logical relationship between the substances or elements or a particular order.

In the drawings, the thickness or size of each layer may be exaggerated, omitted or schematically illustrated for clarity and convenience. In addition, the size of each constituent element does not wholly reflect an actual size thereof.

Figure 2:
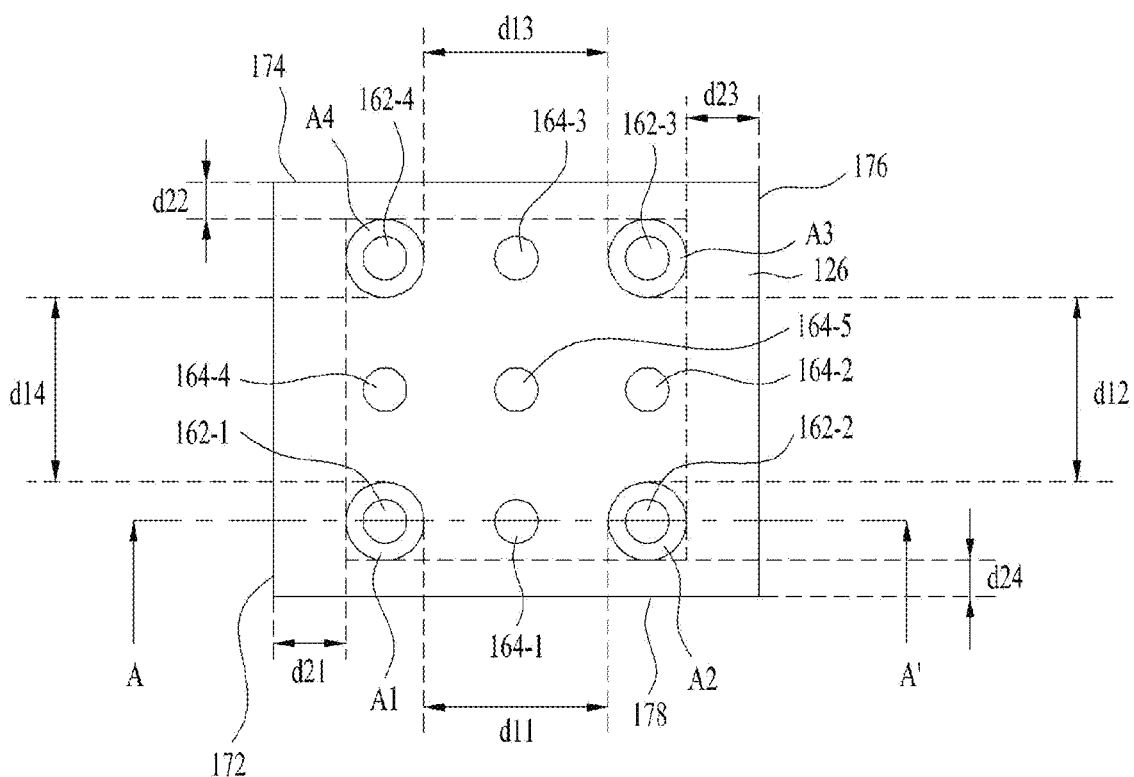
FIG. 2 is a plan view showing a light emitting device according to one embodiment.
Figure 3:
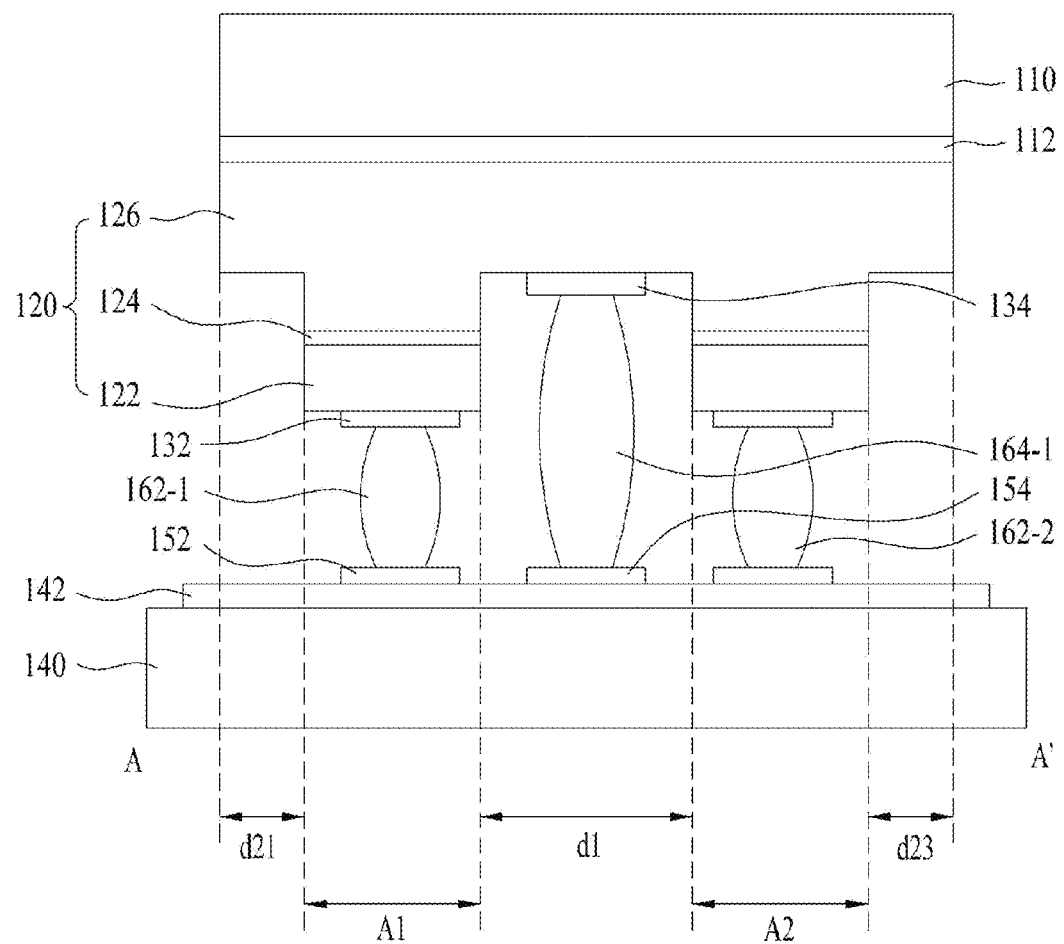
FIG. 3 is a sectional view taken along line A-A' of FIG. 2.

FIG. 2 is a plan view showing a light emitting device 100A according to one embodiment, and FIG. 3 is a sectional view taken along line A-A' of FIG. 2.

Referring to FIGS. 2 and 3, the light emitting device 100A according to the embodiment includes a substrate 110, a buffer layer 112, a light emitting structure 120, first and second electrodes 132 and 134, a sub-mount 140, a protective layer 142, first and second metal pads 152 and 154, first bumps 162-1 to 162-4, and second bumps 164-1 to 164-5. For convenience of description, the first and second electrodes 132 and 134 shown in FIG. 3 are not shown in the light emitting device 100A shown in FIG. 2.

The substrate 110 may be formed of a light transmitting material. For example, the substrate 110 may comprise at least one of $Al_2O_3$, GaN, SiC, ZnO, GaP, InP, $Ga_2O_3$, GaAs, or Si.

The buffer layer 112 may be interposed between the substrate 110 and the light emitting structure 120 to alleviate differences in coefficients of thermal expansion and lattice mismatch of the substrate 110 and the light emitting structure 120. The buffer layer 112 may be formed of a light transmitting material and may comprise, but not limited thereto, at least one material selected from the group consisting of Al, In, N and Ga. In addition, the buffer layer 112 may have a single layer form or a multilayer form. In some cases, the buffer layer 112 may be omitted.

The light emitting structure 120 is disposed under the substrate 110 and includes a first conductive semiconductor layer 122, an active layer 124, and a second conductive semiconductor layer 126.

The first conductive semiconductor layer 122 may be disposed under the active layer 124 and may be formed of a semiconductor compound. Specifically, the first conductive semiconductor layer 122 may be formed of a compound semiconductor, such as group III-V or II-VI compound semiconductor. For example, the first conductive semiconductor layer 122 may be formed of a semiconductor material having a composition of $In_xAl_yGa_{1-x-y}N$ ($0 \leq x \leq 1$, $0 \leq y \leq 1$, $0 \leq x+y \leq 1$). The first conductive semiconductor layer 122 may be doped with a first conductive dopant. When the first conductive semiconductor layer 122 is a p-type semiconductor layer, the first conductive dopant may be a p-type dopant and include Mg, Zn, Ca, Sr, Ba or the like.

The active layer 124 is located between the first conductive semiconductor layer 122 and the second conductive semiconductor layer 126. The active layer 124 is a layer in which holes (or electrons) injected through the first conductive semiconductor layer 122 and electrons (or holes) injected through the second conductive semiconductor layer 126 meet each other to emit light having energy determined by an inherent energy band of a constituent material of the active layer 124. The active layer 124 may have at least one of a single well structure, a multi-well structure, a single quantum well structure, a multi quantum well structure, a quantum wire structure, or a quantum dot structure.

A well layer and a barrier layer of the active layer 124 may have a pair structure of any one or more of InGaN/GaN, InGaN/InGaN, GaN/AlGaN, InAlGaN/GaN, GaAs(InGaAs)/AlGaAs and GaP(InGaP)/AlGaP without being limited thereto. The well layer may be formed of a material having a lower band gap energy than a band gap energy of the barrier layer.

A conductive clad layer (not shown) may be formed on and/or under the active layer 124. The conductive clad layer may be formed of a semiconductor having a higher band gap energy than a band gap energy of the barrier layer of the active layer 124. For example, the conductive clad layer may comprise GaN, AlGaN, InAlGaN, an ultra lattice structure or the like. In addition, the conductive clad layer may be doped with an n-type or p-type dopant. For example, the active layer 124 may emit ultraviolet light having a wavelength band of 100 nm to 400 nm, for example, 100 nm to 280 nm.

The second conductive semiconductor layer 126 may be located between the buffer layer 112 and the active layer 124 and formed of a compound semiconductor, such as a group III-V or II-VI compound semiconductor, doped with a second conductive dopant. When the second conductive semiconductor layer 126 is an n-type semiconductor layer, the second conductive dopant may be an n-type dopant and include, but not limited thereto, Si, Ge, Sn, Se or Te.

The second conductive semiconductor layer 126 may be formed of a light transmitting material. For example, the second conductive semiconductor layer 126 may be formed of a semiconductor material having a composition of $Al_xIn_yGa_{(1-x-y)}N$ ($0 \leq x \leq 1$, $0 \leq y \leq 1$, $0 \leq x+y \leq 1$). The second conductive semiconductor layer 126 may include any one or more of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 122 may be a p-type semiconductor layer and the second conductive semiconductor layer 126 may be an n-type semiconductor layer. Alternatively, the first conductive semiconductor layer 122 may be an n-type semiconductor layer and the second conductive semiconductor layer 126 may be a p-type semiconductor layer.

The light emitting structure 120 may have any one of an n-p junction structure, a p-n junction structure, an n-p-n junction structure, and a p-n-p junction structure.

The first electrode 132 is disposed under the first conductive semiconductor layer 122. The second electrode 134 is disposed under the second conductive semiconductor layer 126 that is exposed by mesa etching.

Each of the first and second electrodes 132 and 134 may reflect or transmit light emitted from the active layer 124 rather than absorbing the light, and may be formed of any high quality material that may be grown under the first and second conductive semiconductor layers 122 and 126, respectively. For example, each of the first and second electrodes 132 and 134 may respectively be formed of metals and may be formed of Ag, Ni, Al, Rh, Pd, Ir, Ru, Mg, Zn, Pt, Au, Hf, and selective combinations thereof.

In particular, the first electrode 132 may be a transparent conductive oxide (TCO) film. For example, the first electrode 132 may comprise, but not limited thereto, at least one of the aforementioned metals, Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IrOx, RuOx, RuOx/ITO, Ni/IrOx/Au, or Ni/IrOx/Au/ITO.

In addition, the first electrode 132 may be a single layer or multiple layers formed of an ohmic reflective electrode material. When the first electrode 132 is an ohmic, electrode, a separate ohmic layer (not shown) may not be formed.

The second electrode 134 may comprise an ohmic contact material and serve as an ohmic electrode. Thus, a separate ohmic layer (not shown) may not be necessary, or a separate ohmic layer may be interposed between the second electrode 134 and the second conductive semiconductor layer 126 as needed.

Meanwhile, the sub-mount 140 may be a semiconductor substrate formed of AlN, BN, SiC, GaN, GaAs, Si or the like, but is not limited thereto, and may be formed of a highly thermally conductive semiconductor material. In addition, elements to prevent electro static discharge (ESD) in the form of Zenor diodes may be included in the sub-mount 140.

When the sub-mount 140 is formed of an electrically conductive material, such as Si, as exemplarily shown in FIG. 3, the protective layer 142 may be further disposed between the first and second metal pads 152 and 154 and the sub-mount 140. Here, the protective layer 142 may be formed of an insulation material.

The first and second metal pads 152 and 154 may be disposed with being electrically spaced apart from each other on the sub-mount 140. Each of the first bumps 162-1 to 162-4 is disposed between the first electrode 132 and the first metal pad 152. Each of the second bumps 164-1 to 164-5 is disposed between the second electrodes 134 and the second metal pad 154.

The first electrode 132 is electrically connected to the first metal pad 152 on the sub-mount 140 via the first bumps 162-1 to 162-4, and the second electrode 134 is electrically connected to the second metal pad 154 on the sub-mount 140 via the second bumps 164-1 to 164-5.

Although not shown, a first upper bump metal layer (not shown) may further be disposed between the first electrode 132 and the first bumps 162-1 to 162-4, and a first lower bump metal layer (not shown) may further be disposed between the first metal pad 152 and the first bumps 162-1 to 162-4. Here, the first upper bump metal layer and the first lower bump metal layer serve to indicate locations where the first bumps 162-1 to 162-4 will be located. Similarly, a second upper bump metal layer (not shown) may further be disposed between the second electrode 134 and the second bumps 164-1 to 164-5, and a second lower bump metal layer (not shown) may further be disposed between the second metal pad 154 and the second bumps 164-1 to 164-5. Here, the second upper bump metal layer and the second lower bump metal layer serve to indicate locations where the second bumps 164-1 to 164-5 will be located.

Figure 1B:
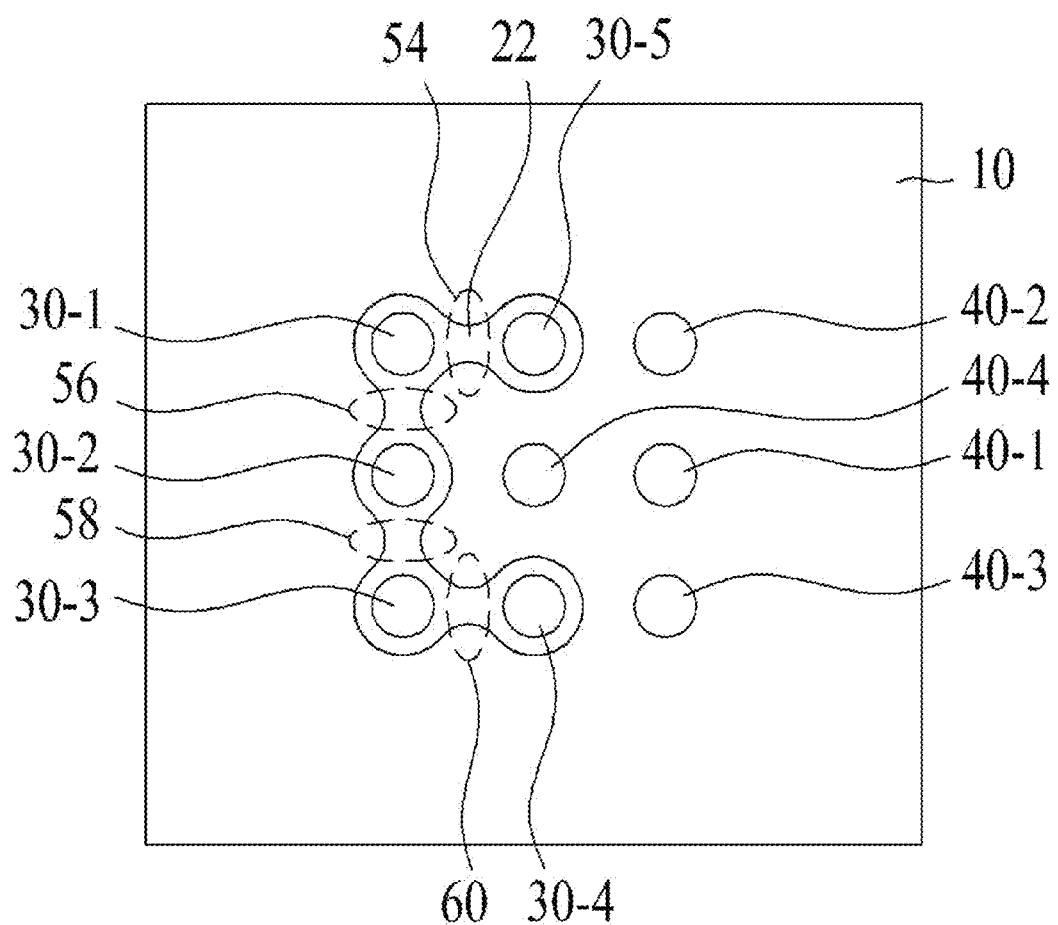

Differently from the conventional light emitting devices exemplarily shown in FIGS. 1A and 1B, in the case of the light emitting device 100A exemplarily shown in FIGS. 2 and 3 according to the embodiment, a plurality of active areas A1 to A4 is disposed with being spaced apart from one another when viewed in plan. That is, the active areas A1 to A4 do not overlap each other. Here, the active areas A1 to A4 refer to areas in which the first conductive semiconductor layer 122 and the active layer 124 are disposed.

Referring to FIG. 2, the second bumps 164-1 to 164-5 are disposed between the active areas A1 to A4 when viewed in plan. More specifically, when viewed in plan, the second bump 164-1 is disposed between the active areas A1 and A2, the second bump 164-2 is disposed between the active areas A2 and A3, the second bump 164-3 is disposed between the active areas A3 and A4, the second bump 164-4 is disposed between the active areas A4 and A1, and the second bump 164-5 is disposed between the active areas A2 and A4 and between the active areas A1 and A3.

First distances d11 to d14 between the active areas A1 to A4 spaced apart from one another may deteriorate luminosity when they exceed 300 μm and may make it difficult to provide a space for arrangement of the second bumps 164-1 to 164-5 when they are below 60 μm. Accordingly, the first distances d11 to d14 between the active areas A1 to A4 spaced apart from one another may be within a range of 60 μm to 300 μm, but embodiments are not limited thereto.

Here, the first distances d11 to d14 may be equal to or different from one another.

In addition, the respective active areas A1 to A4 are spaced apart from edges 172 to 178 of the light emitting device 100A by second distances d21 to d24. The second distances d21 to d24 may cause minor luminosity improvement when they exceed 100 μm and may impact increase in forward bias drive voltage Vf of the light emitting device 100A when they are below 10 μm. Accordingly, the second distances d21 to d24 between the active areas A1 to A4 and the edges 172 to 178 of the light emitting device 100A may be within a range of 10 μm to 100 μm. That is, each of the second distance d21 between the active areas A1 and A4 and the edge 172 of the light emitting device 100A, the second distance d22 between the active areas A3 and A4 and the edge 174 of the light emitting device 100A, the second distance d23 between the active areas A2 and A3 and the edge 176 of the light emitting device 100A, and the second distance d24 between the active areas A1 and A2 and the edge 178 of the light emitting device 100A may be within a range of 10 μm to 100 μm, but embodiments are not limited thereto.

Here, the second distances d21 to d24 may be equal to or different from one another.

In addition, the active areas A1 to A4 may be equidistantly spaced apart from one another and disposed on the periphery of the light emitting device 100 when viewed in plan. More specifically, referring to FIG. 2, the first distance d11 between the active areas A1 and A2, the first distance d12 between the active areas A2 and A3, the first distance d13 between the active areas A3 and A4, and the first distance d14 between the active areas A4 and A1 may be equal to one another, but embodiments are not limited thereto. In another embodiment, the first distances d11 to d14 may be different from one another. The active areas 20 and 22 of the conventional light emitting devices exemplarily shown in FIGS. 1A and 1B are arranged at the center of the light emitting device, whereas the active areas of the light emitting device 100A according to the embodiment as exemplarily shown in FIG. 2 are disposed on the periphery of the light emitting device 100A.

Figure 4A:
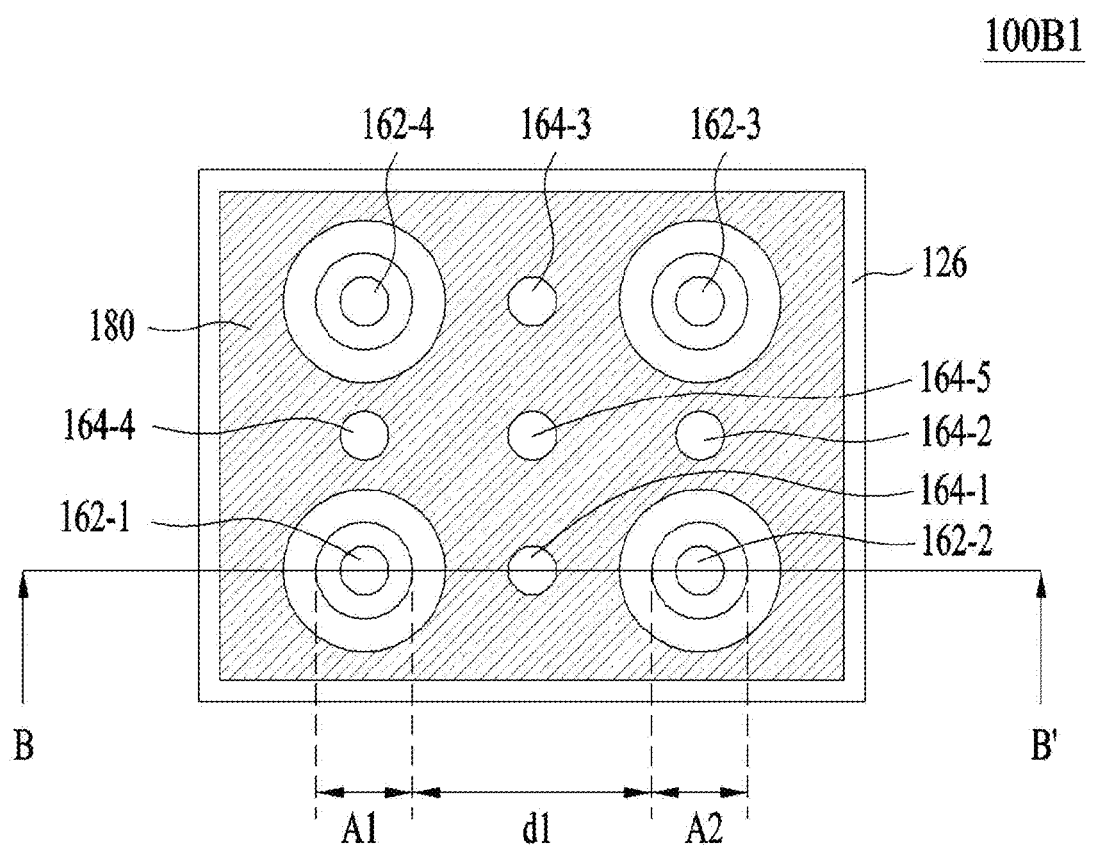
FIGS. 4A and 4B are plan views respectively showing light emitting devices according to another embodiment.
Figure 4B:
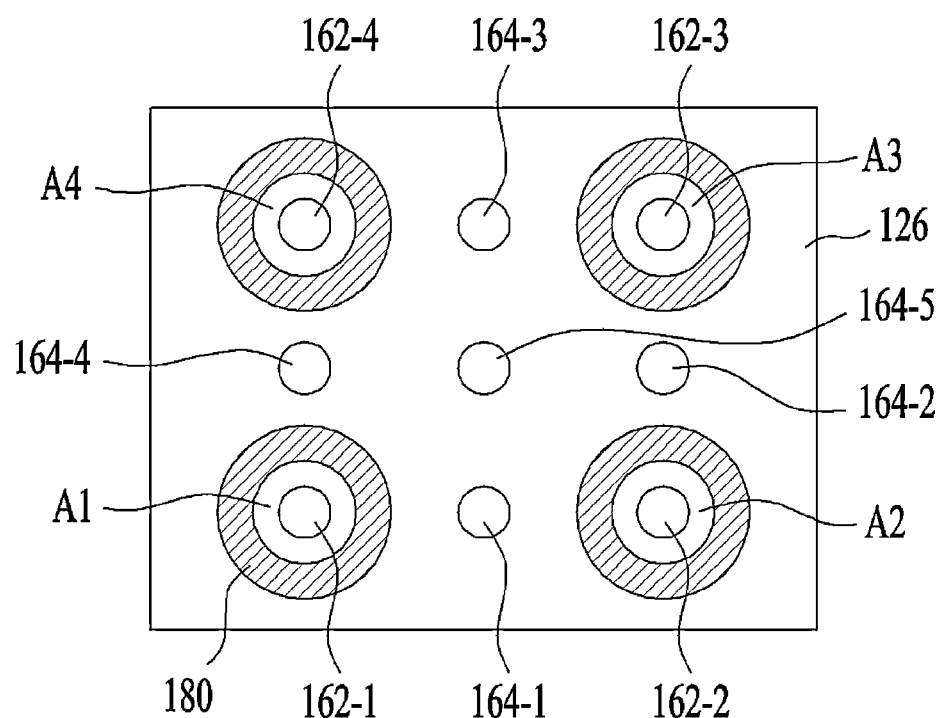
Figure 5:
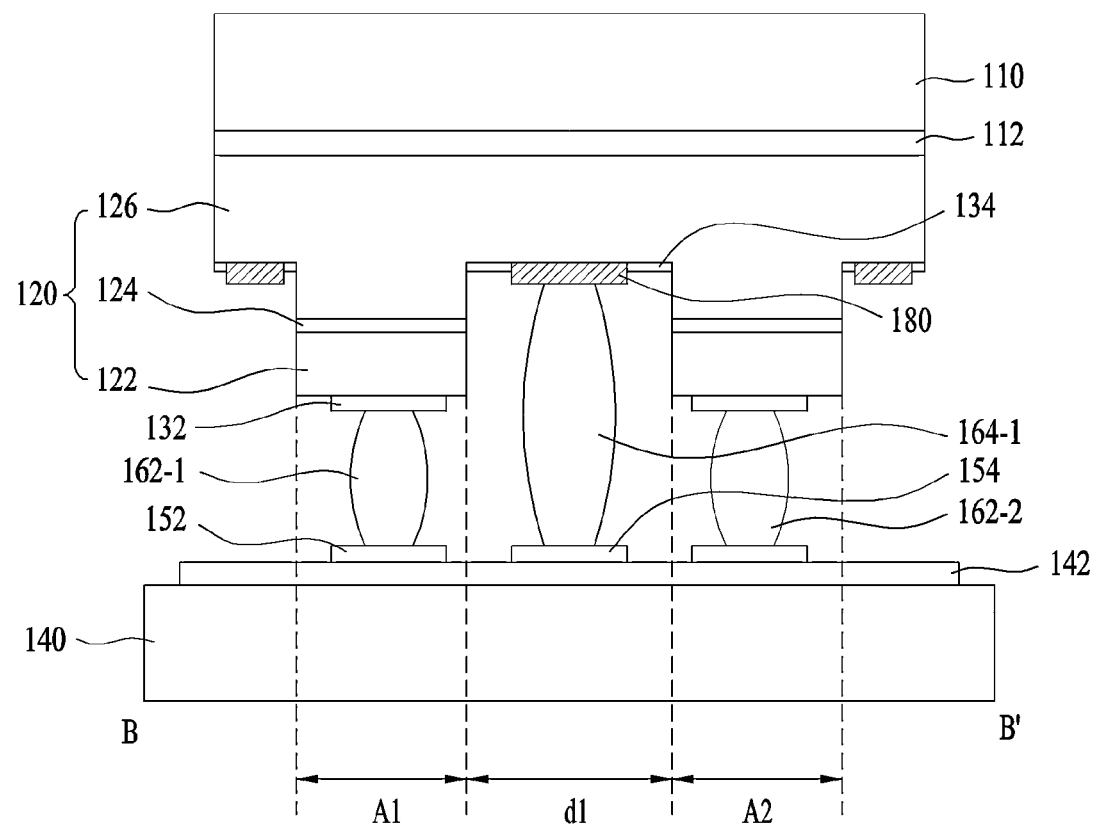
FIG. 5 is a sectional view taken along line B-B' of FIG. 4A.

FIGS. 4A and 4B are plan views respectively showing light emitting devices 100B1 and 100B2 according to another embodiment, and FIG. 5 is a sectional view taken along line B-B' of FIG. 4A. The first and second electrodes 132 and 134 shown in FIG. 5 are not shown in the light emitting device 100B1 of FIG. 4A.

Differently from the light emitting device 100A exemplarily shown in FIGS. 2 and 3, each of the light emitting devices 100B1 and 100B2 exemplarily shown in FIGS. 4A, 4B and 5 further includes a reflective layer 180. Except for this, the light emitting devices 100B1 and 100B2 shown in FIGS. 4A, 4B and 5 are identical to the light emitting device 100A shown in FIGS. 2 and 3, and a description related to the same configuration is omitted hereinafter.

Referring to FIGS. 4A, 4B and 5, the light emitting devices 100B1 and 100B2 respectively include the substrate 110, the buffer layer 112, the light emitting structure 120, the first and second electrodes 132 and 134, the sub-mount 140, the protective layer 142, the first and second metal pads 152 and 154, the first bumps 162-1 to 162-4, the second bumps 164-1 to 164-5, and the reflective layer 180.

As exemplarily shown in FIGS. 4A and 5, the reflective layer 180 may be disposed between the second bumps 164-1 to 164-5 and the second conductive semiconductor layer 126. Alternatively, as in the light emitting device 100B2 exemplarily shown in FIG. 4B, the reflective layer 180 may have an annular plan shape to surround the active areas A1, A2, A3 and A4 and be disposed on the second conductive semiconductor layer 126.

The reflective layer 180 serves to reflect light emitted from the active layer 124 to improve luminous efficacy. The reflective layer 180 may be formed of a reflective material to reflect light. For example, the reflective layer 180 may be a single layer or multiple layers formed of any one of Ag, Ni, Al, Rh, Pd, Ir, Ru, Mg, Zn, Pt, Au, Hf, or alloys of two or more of these metals.

Figure 6A:
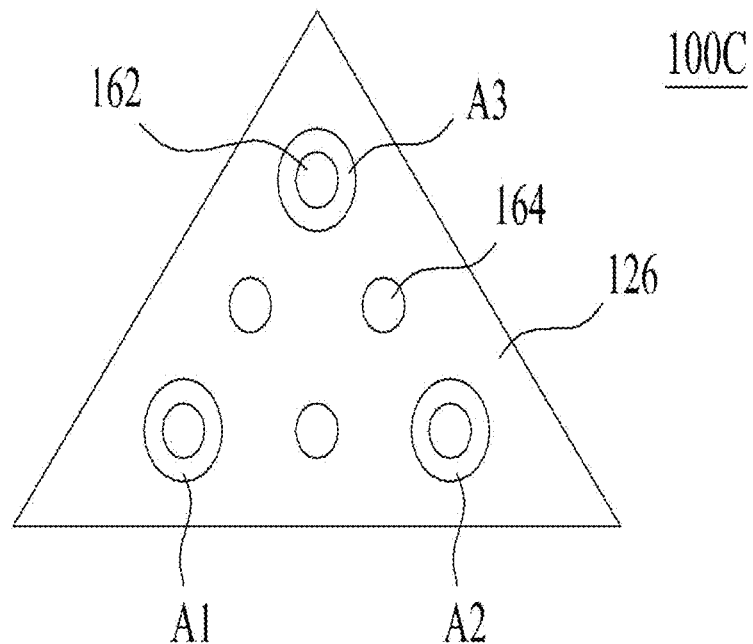
FIGS. 6A to 6C are plan views respectively showing light emitting devices according to a further embodiment.
Figure 6B:
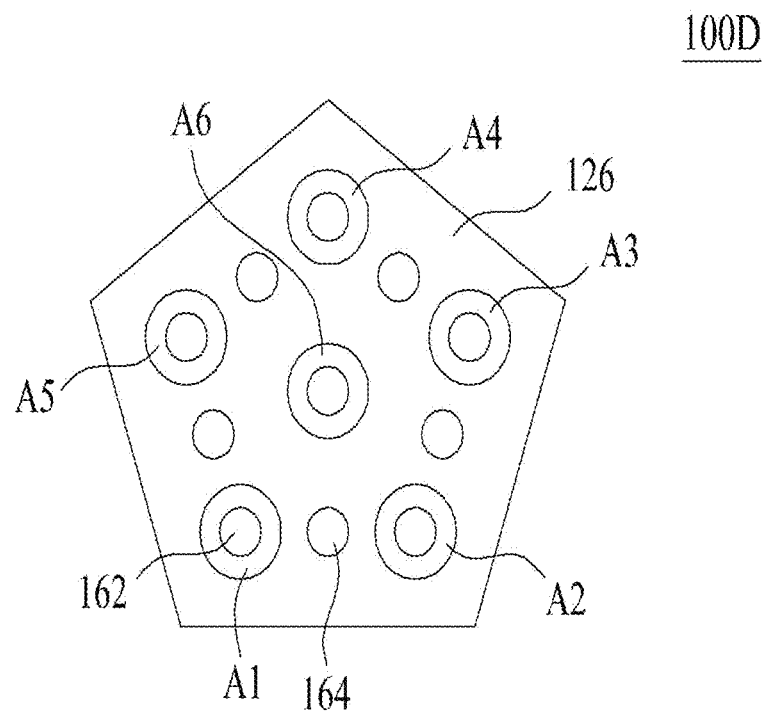
Figure 6C:
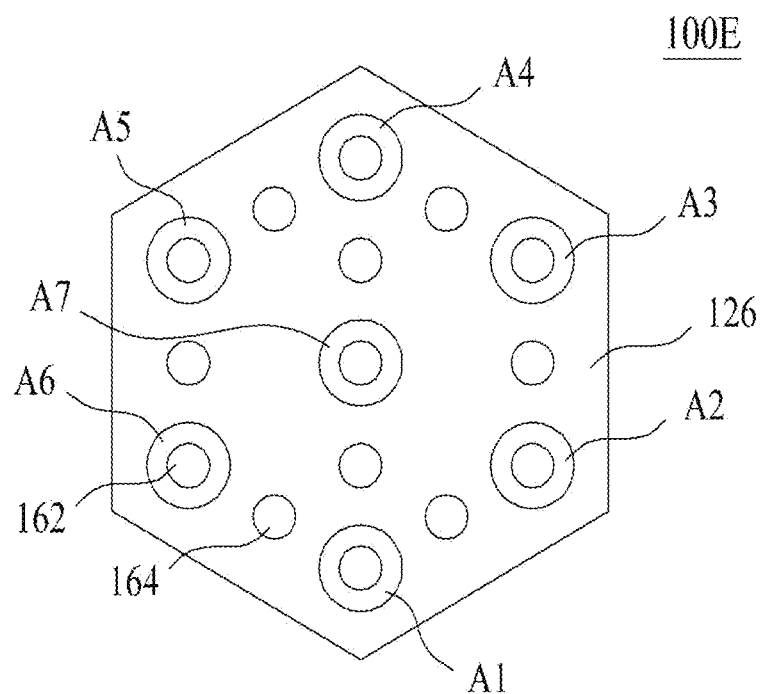

FIGS. 6A to 6C are plan views respectively showing light emitting devices 100C, 100D and 100E according to a further embodiment.

In the above-described light emitting devices 100A, 100B1 and 100B2 exemplarily shown in FIGS. 2, 4A and 4B, the number of the first bumps 162-1 to 162-4 is four, the number of the second bumps 164-1 to 164-5 is five, and the light emitting device 100A has a rectangular plan shape, but embodiments are not limited thereto.

Specifically, the light emitting devices 100C to 100E may have various other polygonal plan shapes except for the rectangular plan shape, and the number of each of the first and second bumps may be altered in various ways. In addition, the active areas may be disposed near corners and/or at the center of a polygon.

For example, as exemplarily shown in FIG. 6A, the light emitting device 100C may have a triangular plan shape, and the active areas A1, A2 and A3 may be disposed near corners of a triangle. In this case, the number of the first bumps 162 is three and the number of the second bumps 164 is three without being limited thereto.

Alternatively, as exemplarily shown in FIG. 6B, the light emitting device 100D may have a pentagonal plan shape, and the active areas A1 to A5 may be disposed near corners of a pentagon and the active area A6 may be disposed at the center of the pentagon. In this case, the number of the first bumps 162 is six and the number of the second bumps 164 is five without being limited thereto.

Alternatively, as exemplarily shown in FIG. 6C, the light emitting device 100E may have a hexagonal plan shape, and the active areas A1 to A6 may be disposed near corners of a hexagon and the active area A7 may be disposed at the center of the hexagon. In this case, the number of the first bumps 162 is seven and the number of the second bumps 164 is eight without being limited thereto.

As will be appreciated from the above-described embodiments, when most of the active areas of the light emitting devices 100A to 100E are disposed near corners of a polygon, the light emitting devices 100A to 100E may achieve greater luminosity than that when the active areas are disposed at the center of the polygon.

For example, as compared to FIG. 1B in which the active areas are disposed with being deviated to one side of the polygonal plan shape, the embodiment in which the active areas are evenly disposed near respective corners of a polygon may achieve enhanced luminosity.

In addition, on the basis of a limited plan size of the light emitting device, the greater number of the first bumps disposed in the active areas may achieve enhanced heat radiation. That is, the greater number of the active areas may achieve enhanced heat radiation. However, as exemplarily shown in FIGS. 1A and 1B, overlapping portions 50 to 60 of the active areas 20 or 22 may exhibit deteriorated heat radiation.

According to the embodiments, as exemplarily shown in FIGS. 2, 4A, 4B and 6A to 6C, the active areas A1 to A7 are spaced apart from one another without the overlapping portions 50 to 60 when viewed in plan, thereby enhancing heat radiation of the light emitting devices.

Figure 7A:
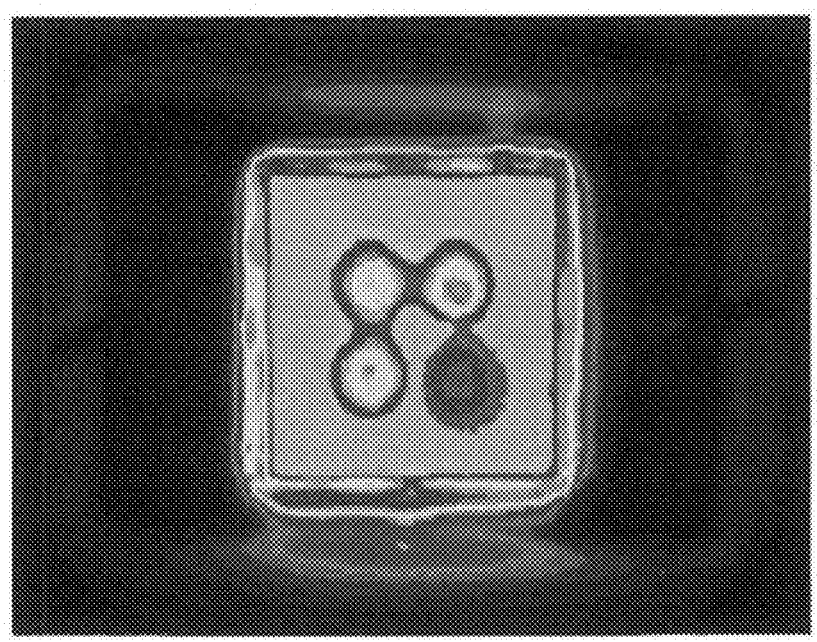
FIGS. 7A to 7C are pictures showing heat radiation from the conventional light emitting devices and the light emitting device of the embodiment.
Figure 7A:
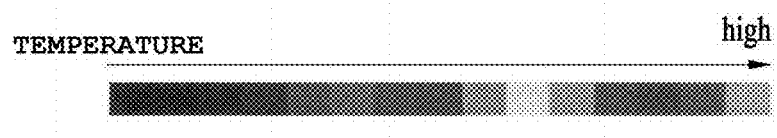
Figure 7B:
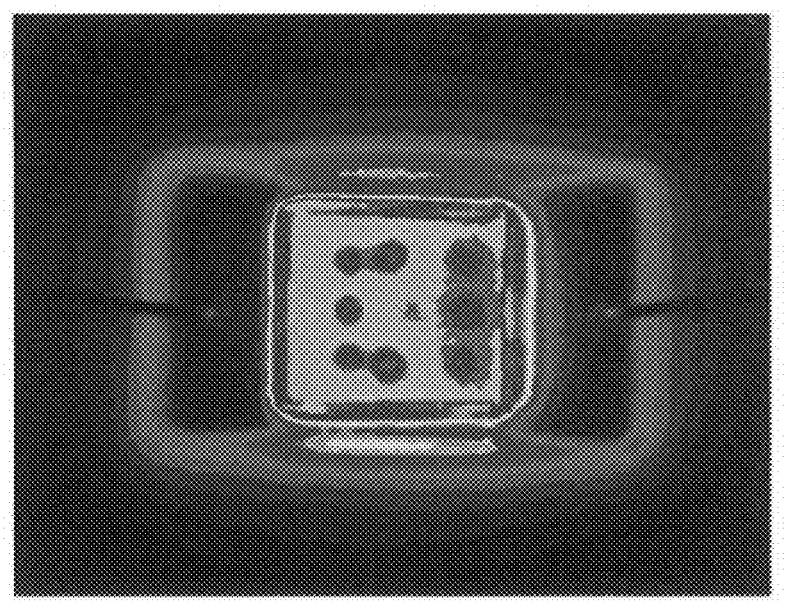
Figure 7B:
Figure 7C:
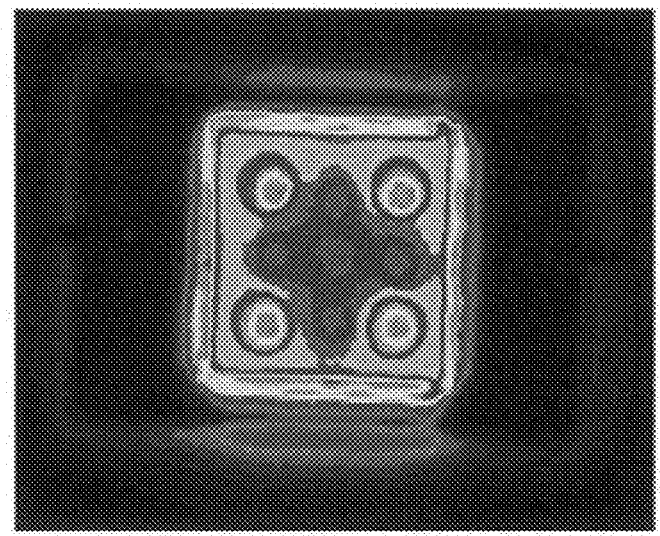
Figure 7C:

FIGS. 7A to 7C are pictures showing heat radiation from the conventional light emitting devices and the light emitting device of the embodiment. More specifically, FIGS. 7A and 7B are respectively pictures showing plan shapes of the conventional light emitting devices shown in FIGS. 1A and 1B in plan view, and FIG. 7C is a picture showing a plan shape of the light emitting device 100A according to the embodiment shown in FIG. 2.

Referring to FIGS. 7A to 7C, it will be appreciated that the light emitting device of the embodiment emits a considerably greater amount of heat than the conventional light emitting devices.

While a method of manufacturing the light emitting device according to the above-described embodiment will be described below with reference to FIGS. 8A to 8E, embodiments are not limited thereto and it will be appreciated that the light emitting device of the embodiment may be manufactured via any of various other methods.

FIGS. 8A to 8E are sectional views explaining a method of manufacturing the light emitting device 100A according to the embodiment.

Figure 8A:
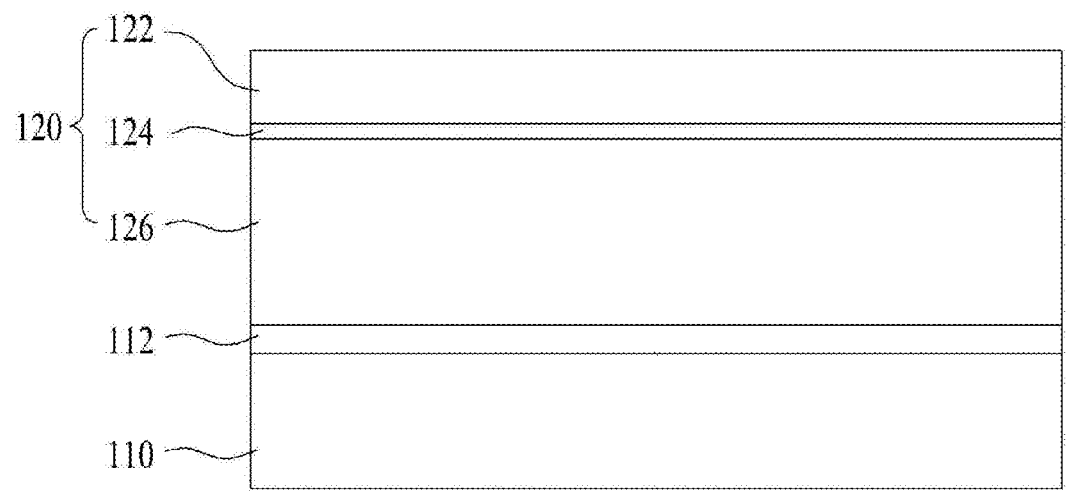
FIGS. 8A to 8E are sectional views explaining a method of manufacturing the light emitting device according to the embodiment.

Referring to FIG. 8A, the substrate 110 is prepared. The substrate 110 may be prepared with a light transmitting material. For example, the substrate 110 may be prepared with at least one of $Al_2O_3$, GaN, SiC, ZnO, GaP, InP, $Ga_2O_3$, GaAs, or Si.

The buffer layer 112 and the light emitting structure 120 are formed on the substrate 110. The buffer layer 112 may be formed of a light transmitting material. The buffer layer 112 may be formed of at least one material selected from the group consisting of Al, In, N and Ga without being limited thereto. In addition, the buffer layer 112 may have a single layer form or a multilayer form. In some cases, the buffer layer 112 may be omitted.

To form the light emitting structure 120, the second conductive semiconductor layer 126, the active layer 124 and the first conductive semiconductor layer 122 are sequentially formed on the buffer layer 112.

First, the second conductive semiconductor layer 126 may be formed on the buffer layer 112. The second conductive semiconductor layer 126 may be formed of a group III-V or II-V compound semiconductor doped with a second conductive dopant. When the second conductive semiconductor layer 126 is an n-type semiconductor layer, the second conductive dopant may be an n-type dopant and may include, but not limited thereto, Si, Ge, Sn, Se or Te.

The second conductive semiconductor layer 126, for example, may be formed of a semiconductor material having a composition of $In_xAl_yGa_{(1-x-y)}N$ (0≤x≤1, 0≤y≤1, 0≤x≤y≤1). The second conductive semiconductor layer 126 may be formed of any one or more of GaN, InN, AlN, InGaN, AlGaN, InAlGaN, AlInN, AlGaAs, InGaAs, AlInGaAs, GaP, AlGaP, InGaP, AlInGaP, and InP.

The active layer 124 is formed on the second conductive semiconductor layer 126. The active layer 124 may have at least one of a single well structure, a multi-well structure, a single quantum well structure, a multi quantum well structure, a quantum wire structure, or a quantum dot structure. For example, the active layer 124 may have a multi quantum well structure formed via injection of trimethyl gallium (TMGa) gas, ammonia ($NH_3$) gas, nitrogen ($N_2$) gas, and trimethyl indium (TMIn) gas, but the embodiment is not limited thereto.

A well layer and a barrier layer of the active layer 124 may have a pair structure of any one or more of InGaN/GaN, InGaN/InGaN, GaN/AlGaN, InAlGaN/GaN, GaAs(InGaAs)/AlGaAs and GaP(InGaP)/AlGaP without being limited thereto. The well layer may be formed of a material having a lower band gap energy than a band gap energy of the barrier layer.

A conductive clad layer (not shown) may be formed on and/or under the active layer 124. The conductive clad layer may be formed of a semiconductor having a higher band gap energy than a band gap energy of the barrier layer of the active layer 124. For example, the conductive clad layer may comprise GaN, AlGaN, InAlGaN, an ultra lattice structure or the like. In addition, the conductive clad layer may be doped with an n-type or p-type dopant.

The first conductive semiconductor layer 122 is formed on the active layer 124. The first conductive semiconductor layer 122 may be formed of a group III-V or II-VI compound semiconductor and doped with a first conductive dopant. When the first conductive semiconductor layer 122 is a p-type semiconductor layer, the first conductive dopant may be a p-type dopant and include Mg, Zn, Ca, Sr, Ba or the like. The first conductive semiconductor layer 122 may be formed of a semiconductor material having a composition of $In_xAl_yGa_{1-x-y}N$ (0≤x≤1, 0≤y≤1, 0≤x+y≤1).

Figure 8B:
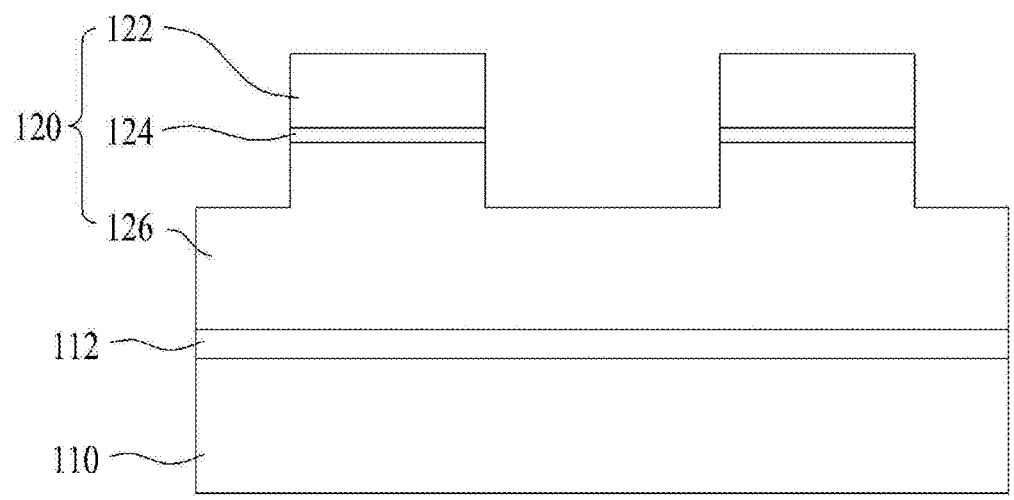

Next, referring to FIG. 8B, portions of the second conductive semiconductor layer 126, the active layer 124, and a part of the first conductive semiconductor layer 122 are removed via mesa etching to expose the second conductive semiconductor layer 126.

Figure 8C:
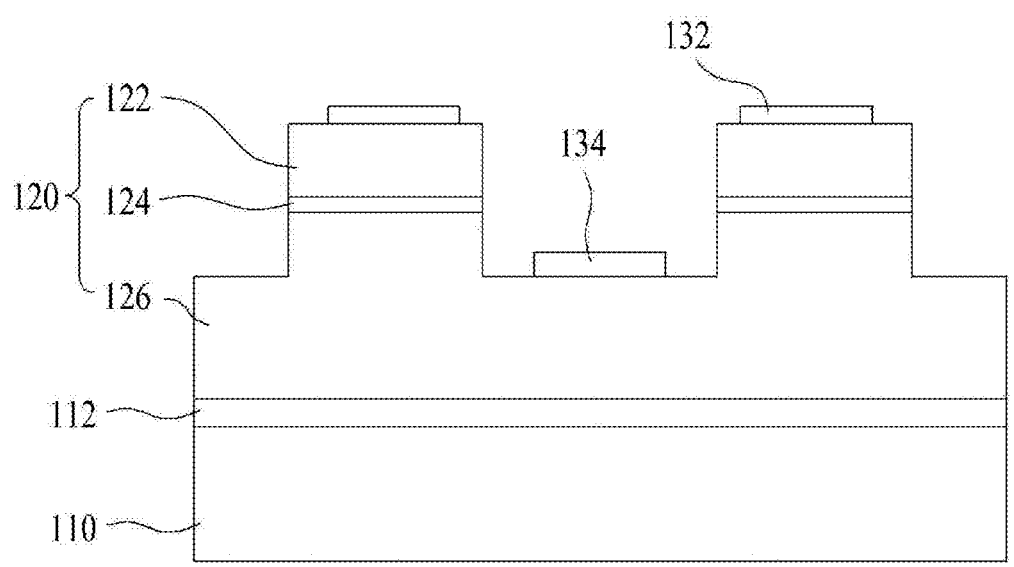

Next, referring to FIG. 8C, the first electrode 132 is formed on the first conductive semiconductor layer 122 and the second electrode 134 is formed on the exposed second conductive semiconductor layer 126. The first and second electrodes 132 and 134 may respectively be formed of metals selected from the group consisting of Ag, Ni, Al, Rh, Pd, Ir, Ru, Mg, Zn, Pt, Au, Hf and selective combinations thereof.

In particular, the first electrode 132 may be a transparent conductive oxide (TCO) film. For example, the first electrode 132 may be formed of at least one of the aforementioned metals, ITO, IZO, IZTO, IAZO, IGZO, IGTO, AZO, ATO, GZO, IrOx, RuOx, RuOx/ITO, Ni/IrOx/Au, or Ni/IrOx/Au/ITO without being limited thereto.

In addition, the first electrode 132 may take the form of a single layer or multiple layers formed of an ohmic reflective electrode material. When the first electrode 132 serves as an ohmic electrode, a separate ohmic layer (not shown) may not be formed.

The second electrode 134 may comprise an ohmic contact material and serve as an ohmic electrode. Thus, a separate ohmic layer (not shown) may not be necessary, or a separate ohmic layer may be interposed between the second electrode 134 and the second conductive semiconductor layer 126 as needed.

Figure 8D:
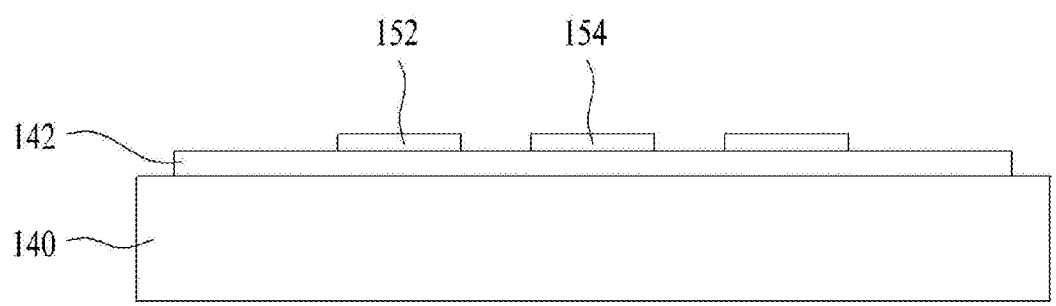

Referring to FIG. 8D, the first and second metal pads 152 and 154 may be formed on the sub-mount 140 through a separate process while the processes shown in FIGS. 8A to 8C progress. The sub-mount 140 may be a semiconductor substrate formed of AlN, BN, SiC, GaN, GaAs, Si or the like without being limited thereto, and may be formed of a highly thermally conductive semiconductor material.

When the sub-mount 140 is formed of Si, the protective layer 142 may be formed on the sub-mount 140 prior to forming the first and second metal pads 152 and 154. This is because it is necessary to electrically insulate the first and second metal pads 152 and 154 on the conductive silicon sub-mount 140. The protective layer 142 may be formed of an insulation material.

Figure 8E:
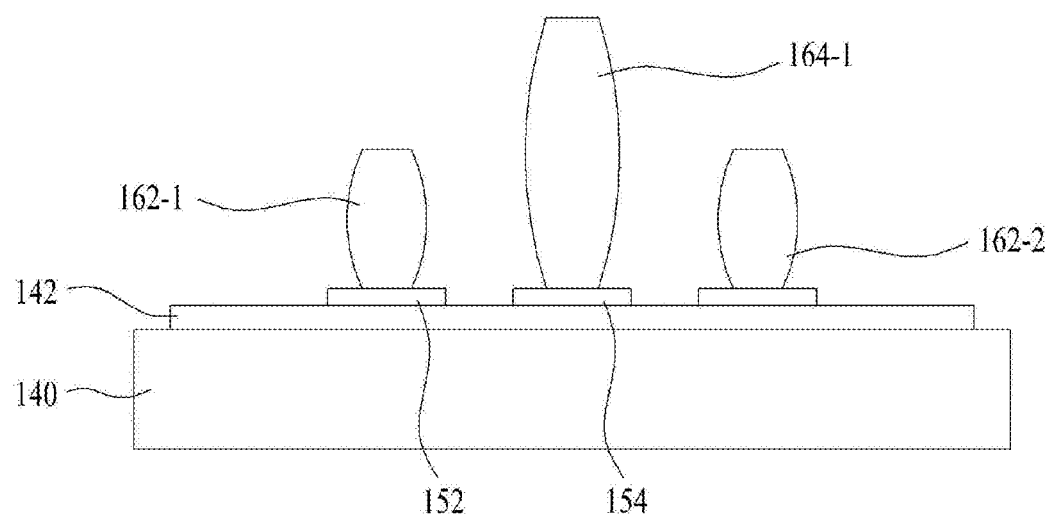

Thereafter, referring to FIG. 8E, the first bumps 162-1 and 162-2 and the second bump 164-1 are formed respectively on the first and second metal pads 152 and 154.

Thereafter, after inverting the light emitting device 100A such that the substrate 110 becomes the top, the resulting structure exemplarily shown in FIG. 8E is coupled to the inverted light emitting device 100A. In this case, the first electrode 132 and the first metal pad 152 are coupled to each other via the first bumps 162-1 and 162-2 and the second electrode 134 and the second metal pad 154 are coupled to each other via the second bump 164-1.

Figure 9:
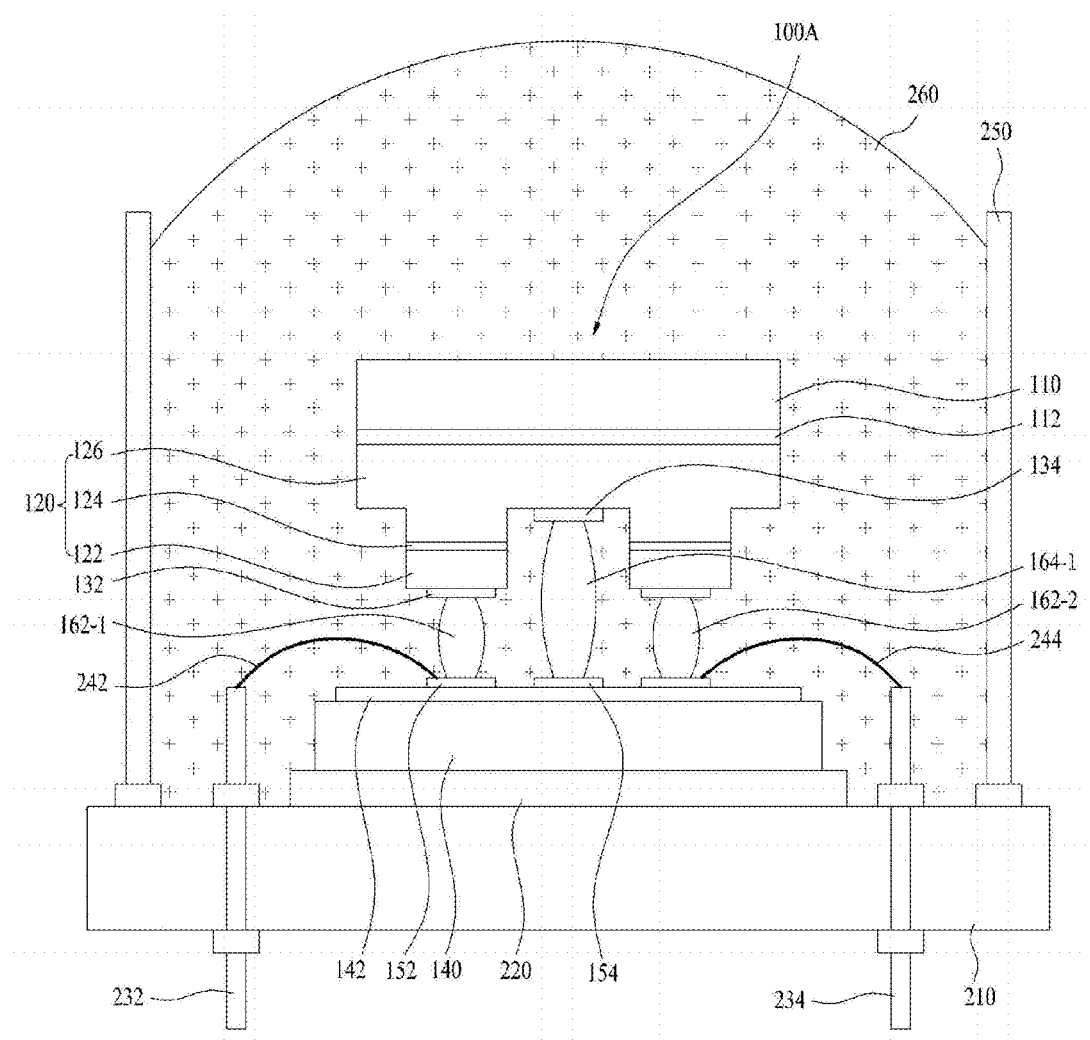
FIG. 9 is a sectional view showing a light emitting device package according to an embodiment.

FIG. 9 is a sectional view showing a light emitting device package 200 according to an embodiment.

The light emitting device package 200 according to the embodiment includes the light emitting device 100A, a header 210, an adhesive 220, first and second lead wires 232 and 234, first and second wires 242 and 244, a sidewall 250, and a molding member 260. The light emitting device 100A is the light emitting device shown in FIGS. 2 and 3 and is shown with the same reference numerals and, thus, a detailed description related thereto is omitted. Instead of the light emitting device 100A shown in FIGS. 2 and 3, of course, any one of the light emitting devices 100B1 to 100E shown in FIGS. 4A to 6C may be part of the light emitting device package 200 shown in FIG. 9.

The sub-mount 140 is disposed on the header 210. For example, the sub-mount 140 may be connected to the header 210 via the adhesive 220. The adhesive 220 may be a solder or paste.

The sidewall 250 is disposed on the header 210 to define a cavity. The light emitting device 100A may be configured to be disposed in the cavity above the header 210.

The first and second metal pads 152 and 154 of the light emitting device 100A are electrically connected to the first and second wires 242 and 244, respectively. The first and second lead wires 232 and 234 are electrically connected to the first and second metal pads 152 and 154 via the first and second wires 242 and 244, respectively. As such, power is supplied to the light emitting device 100A through one pair of lead wires 232 and 234 electrically separated from each other.

The molding member 260 may fill the cavity of the package 200 defined by the sidewall 250 to enclose and protect the light emitting device 100A. In addition, the molding member 260 may contain a phosphor substance to change a wavelength of light emitted from the light emitting device 100A.

In another embodiment, a plurality of light emitting device packages may constitute an array on a board, and an optical member including a light guide plate, a prism sheet, a diffusive sheet, a phosphor sheet and the like may be disposed on a path of light emitted from the light emitting device packages. The light emitting device packages, the board, and the optical member may function as a backlight unit or a lighting unit. Examples of a lighting system may include a backlight unit, a lighting unit, an indicator light, a lamp, and a street light.

Figure 10:
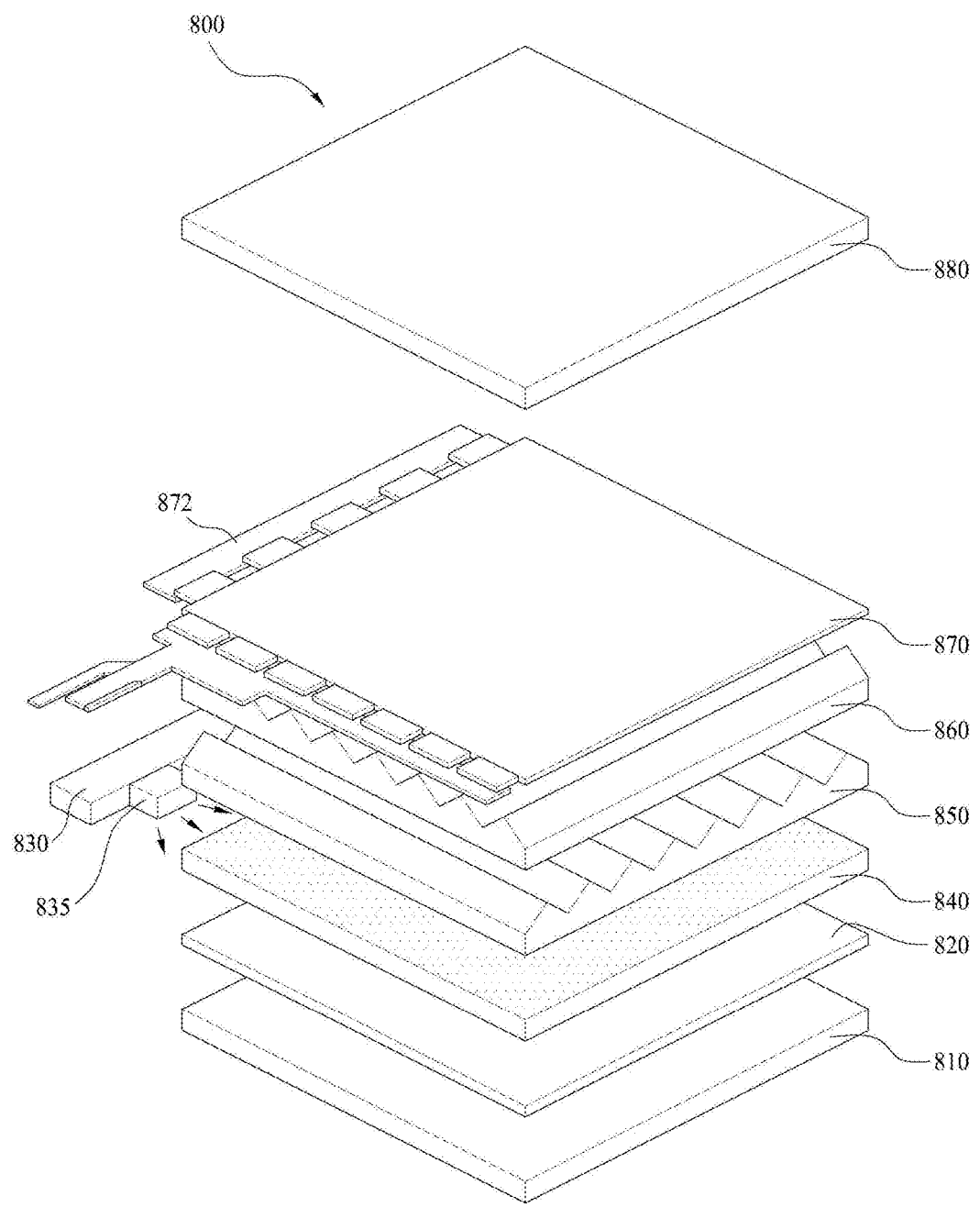
FIG. 10 is a view showing a display apparatus including light emitting device packages according to an embodiment.

FIG. 10 is a view showing a display apparatus 800 including light emitting device packages according to an embodiment.

Referring to FIG. 10, the display apparatus 800 may include a bottom cover 810, a reflective plate 820 disposed on the bottom cover 810, a light emitting module 830 and 835 to emit light, a light guide plate 840 disposed in front of the reflective plate 820 to guide light emitted from the light emitting module 830 and 835 to the front side of the display apparatus 800, an optical sheet including prism sheets 850 and 860 disposed in front of the light guide plate 840, a display panel 870 disposed in front of the optical sheet, an image signal output circuit 872 connected to the display panel 870 to supply image signals to the display panel 870, and a color filter 880 disposed in front of the display panel 870. Here, the bottom cover 810, the reflective plate 820, the light emitting module 830 and 835, the light guide plate 840, and the optical sheet may constitute a backlight unit.

The light emitting module may include light emitting device packages 835 mounted on a board 830. Here, the board 830 may be a printed circuit board (PCB) or the like. The light emitting device packages 835 may correspond to the light emitting device package 200 according to the embodiment shown in FIG. 9.

The bottom cover 810 may accommodate components of the display apparatus 800. The reflective plate 820 may be a separate component as shown in the drawing, and may be a highly reflective material coated over a rear surface of the light guide plate 840 or a front surface of the bottom cover 810.

Here, the reflective plate 820 may be formed of a material that has high reflectivity and is available in an ultra thin form. The reflective plate 820 may be formed of polyethylene terephthalate (PET).

The light guide plate 840 may be formed of polymethylmethacrylate (PMMA), polycarbonate (PC), polyethylene (PE) or the like.

The first prism sheet 850 may be constructed of an elastic and light transmitting polymeric material on a surface of a support film. The polymeric material may define a prism layer provided with a plurality of repeatedly formed 3-dimensional patterns. Here, the patterns may include stripe patterns defined by repeated ridges and valleys as shown in the drawing.

In the second prism sheet 860, a direction of ridges and valleys on a surface of a support film may be perpendicular to a direction of the ridges and valleys of the surface of the support film of the first prism sheet 850. This serves to allow light transmitted from the light emitting module and the reflective sheet to be uniformly transmitted to the entire surface of the display panel 870.

In addition, although not shown, a diffuser sheet may be disposed between the light guide plate 840 and the first prism sheet 850. The diffuser sheet may be formed of polyester, polycarbonate or the like and may serve to maximize a light projection angle via refraction and scattering of light introduced from the backlight unit. In addition, the diffuser sheet may include a support layer containing a light diffuser and a first layer and a second layer formed respectively on a light exit surface (facing the first prism sheet) and a light entrance surface (facing the reflective plate) of the support layer, the first and second layers having no diffuser.

In the embodiment, the diffuser sheet, the first prism sheet 850 and the second prism sheet 860 constitute an optical sheet. Various other combinations of the optical sheet are possible. For example, the optical sheet may include a micro-lens array, a combination of a diffuser sheet and a micro-lens array, or a combination of a single prism sheet and a micro-lens array.

The display panel 870 may be a liquid crystal display panel, or may be any other kind of a device that requires a light source.

Figure 11:
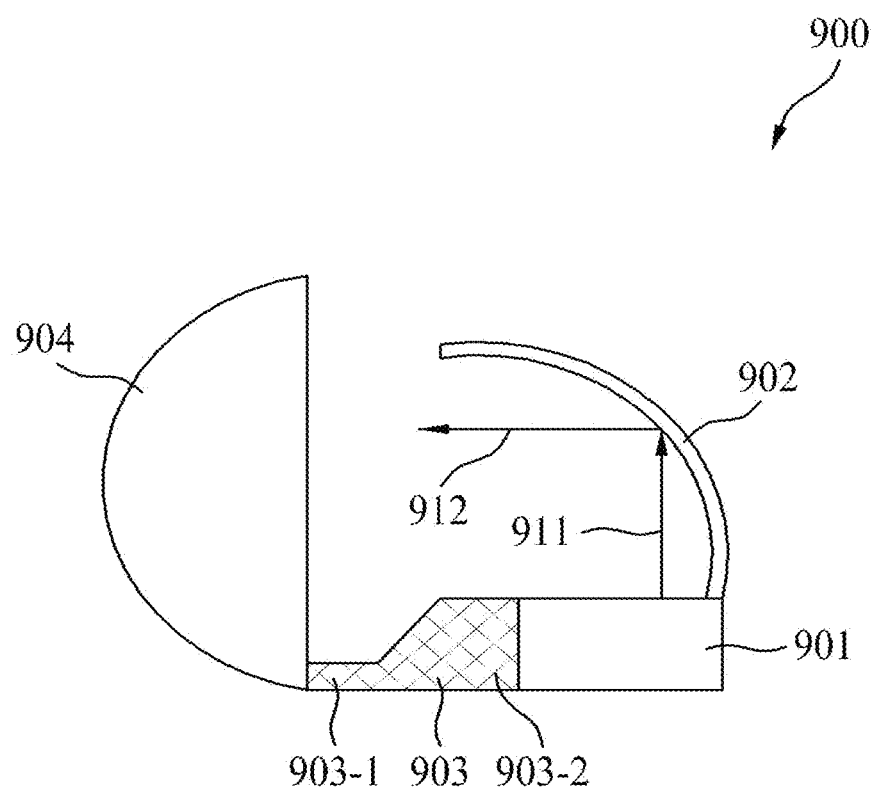
FIG. 11 is a view showing a headlight including light emitting device packages according to an embodiment.

FIG. 11 is a view showing a headlight 900 including light emitting device packages according to an embodiment.

Referring to FIG. 11, the headlight 900 includes a light emitting module 901, a reflector 902, a shade 903, and a lens 904.

The light emitting module 901 may include a plurality of light emitting device packages (not shown) disposed on a board (not shown). In this case, the light emitting device package may correspond to the light emitting device package 200 according to the embodiment shown in FIG. 9.

The reflector 902 serves to reflect light 911 emitted from the light emitting module 901 in a given direction, for example, in a forward direction 912.

The shade 903 is a member disposed between the reflector 902 and the lens 904 to block or reflect some of light reflected from the reflector 902 to the lens 904 so as to achieve a desired light distribution pattern. A portion 903-1 and the other portion 903-2 of the shade 903 may have different heights.

Light emitted from the light emitting module 901 may be reflected by the reflector 902 and the shade 903 and then pass through the lens 904 to thereby be directed forward of a vehicle body. The lens 904 may forwardly refract the light reflected by the reflector 902.

Figure 12:
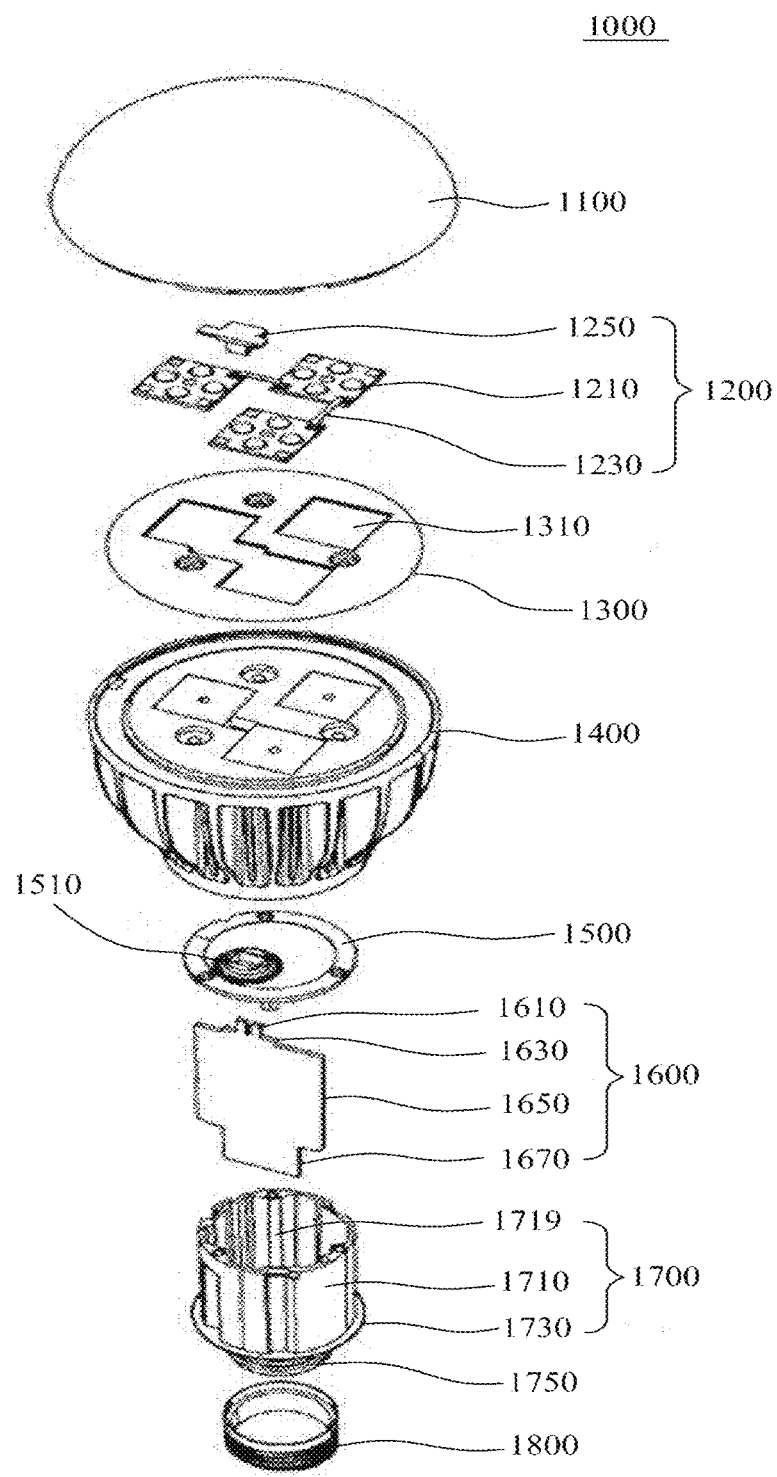
FIG. 12 is a view showing a lighting apparatus including light emitting devices or light emitting device packages according to an embodiment.

FIG. 12 is a view showing a lighting apparatus 1000 including light emitting devices or light emitting device packages according to an embodiment.

Referring to FIG. 12, the lighting apparatus 1000 may include a cover 1100, a light source module 1200, a radiator 1400, a power supply unit 1600, an inner case 1700, and a socket 1800. In addition, the lighting apparatus 1000 according to the embodiment may further include any one or more of a member 1300 and a holder 1500.

The light source module 1200 may include any of the light emitting devices 100A to 100E shown in FIGS. 2 to 6C, or may include the light emitting device package 200 shown in FIG. 9.

The cover 1100 may take the form of a hollow bulb or semi-sphere having an opening. The cover 1100 may be optically coupled to the light source module 1200. For example, the cover 1100 may diffuse, scatter or excite light emitted from the light source module 1200. The cover 1100 may serve as an optical member. The cover 1100 may be coupled to the radiator 1400. The cover 1100 may have a coupling portion to be coupled to the radiator 1400.

An inner surface of the cover 1100 may be coated with ivory white paint. The ivory white paint may contain a diffuser to diffuse light. A surface roughness of the inner surface of the cover 1100 may be greater than a surface roughness of an outer surface of the cover 1100. This serves to sufficiently scatter and diffuse light emitted from the light source module 1200 so as to emit the light to the outside.

The cover 1100 may be formed of glass, plastic, polypropylene (PP), polyethylene (PE), or polycarbonate (PC), for example. Here, polycarbonate is advantageous to achieve excellent light-resistance, heat-resistance, and mechanical strength. The cover 1100 may be transparent such that the light source module 1200 can be seen from the outside without being limited thereto. Alternatively, the cover 100 may be opaque. The cover 1100 may be formed via blow molding.

The light source module 1200 may be disposed on a surface of the radiator 1400. Thus, heat from the light source module 1200 is transferred to the radiator 1400. The light source module 1200 may include light sources 1210, connection plates 1230, and a connector 1250.

The member 1300 may be disposed on an upper surface of the radiator 1400, and have guide recesses 1310 for insertion of the light sources 1210 and the connector 1250. The guide recesses 1310 may correspond to or be aligned with boards of the light sources 1210 and the connector 1250.

A reflective material may be applied to or coated over a surface of the member 1300.

For example, white paint may be applied to or coated over the surface of the member 1300. The member 1300 reflects light from the inner surface of the cover 1100 to the light source module 1200 to return the light to the cover 1100. As such, the lighting apparatus 1000 according to the embodiment may achieve enhanced luminous efficacy.

The member 1300 may be formed of an insulation material, for example. The connection plates 1230 of the light source module 1200 may be formed of an electrically conductive material. Electric contact between the radiator 1400 and the connection plates 1230 may occur. The member 1300 formed of an insulation material may serve to prevent electrical short-circuit between the connection plates 1230 and the radiator 1400. The radiator 1400 may radiate heat from the light source module 1200 and heat from the power supply unit 1600.

The holder 1500 is configured to close a receiving recess 1719 defined by an insulating portion 1710 of the inner case 1700. As such, the power supply unit 1600, received inside the insulating portion 1710 of the inner case 1700, may be hermetically sealed. The holder 1500 may have a guide protrusion 1510. The guide protrusion 1510 may have a hole for penetration of a protrusion 1610 of the power supply unit 1600.

The power supply unit 1600 processes or converts an external electrical signal to transmit the same to the light source module 1200. The power supply unit 1600 may be received in the receiving recess 1719 of the inner case 1700, and be hermetically sealed in the inner case 1700 by the holder 1500. The power supply unit 1600 may include the protrusion 1610, a guide portion 1630, a base 1650, and an extension portion 1670.

The guide portion 1630 may be configured to protrude outward from one side of the base 1650. The guide portion 1630 may be inserted into the holder 1500. A plurality of elements may be arranged on one surface of the base 1650. The elements, for example, may include a DC converter to convert AC power from an external power source into DC power, a drive chip to control driving of the light source module 1200, and an Electro-Static Discharge prevention element to protect the light source module 1200 without being limited thereto.

The extension portion 1670 may be configured to protrude outward from the other side of the base 1650. The extension portion 1670 may be inserted into a connection portion 1750 of the inner case 1700 to receive an electrical signal from an external source. For example, a width of the extension portion 1670 may be equal to or less than a width of the connection portion 1750 of the inner case 1700. The extension portion 1670 may be electrically connected to one end of a positive electrical wire and one end of a negative electrical wire, and the other end of the positive electrical wire and the other end of the negative electrical wire may be electrically connected to the socket 1800.

The inner case 1700 may include a molding part as well as the power supply unit 1600 therein. The molding part is formed of hardened molding liquid, and may serve to fix the power supply unit 1600 within the inner case 1700.

As is apparent from the above description, in light emitting device and light emitting device package including the same according to the embodiments, active areas are disposed near corners of a light emitting device having a polygonal plan shape rather than the center of the device, thereby enhancing luminosity and, consequently, luminous efficacy. Moreover, the active areas are spaced apart from one another without overlapping portions when viewed in plan, which may result in good heat radiation.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a substrate;
a light emitting structure disposed under the substrate, the light emitting structure including a first conductive semiconductor layer, an active layer, and a second conductive semiconductor layer;
a sub-mount;
first metal pads and second metal pads disposed on the sub-mount and configured to be electrically spaced apart from one another;
first bumps disposed between the first conductive semiconductor layer and the first metal pads; and
second bumps located between the second conductive semiconductor layer and the second metal pads,
wherein a plurality of active areas in which the first semiconductor layer, the active layer, and the first bumps are disposed are spaced apart from one another when viewed in plan, and
wherein the second bumps are not disposed in the active areas, the first bumps disposed in the active areas are spaced apart from one another when viewed in plan, and each of the second bumps is disposed between the first bumps when viewed in plan.

2. The device according to claim 1, wherein the active areas are spaced apart from one another by a distance within a range of 60 μm to 300 μm.

3. The device according to claim 1, wherein the active areas are spaced apart from edges of the light emitting device by a distance within a range of 10 μm to 100 μm.

4. The device according to claim 1, wherein the active areas are spaced apart from edges of the light emitting device by the same distance.

5. The device according to claim 1, wherein the active areas are spaced apart from edges of the light emitting device by different distances.

6. The device according to claim 1, wherein the second bumps are disposed between the active areas when viewed in plan.

7. The device according to claim 1, wherein each of the first bumps has a circular plan shape.

8. The device according to claim 1, wherein each of the second bumps has a circular plan shape.

9. The device according to claim 1, further comprising a reflective layer disposed between each of the second bumps and the second conductive semiconductor layer.

10. The device according to claim 1, further comprising a reflective layer having an annular plan shape to surround the active areas.

11. The device according to claim 1, wherein the active areas are equidistantly spaced apart from one another when viewed in plan.

12. The device according to claim 1, wherein the active areas are spaced apart from one another by different distances when viewed in plan.

13. The device according to claim 1, wherein the active areas are disposed on the periphery of the light emitting device when viewed in plan.

14. The device according to claim 1, wherein the light emitting device has a polygonal plan shape.

15. The device according to claim 1, wherein the active layer is configured to emit light having a wavelength range of 100 nm to 280 nm.

16. The device according to claim 6, wherein the second bumps are disposed in a cross shape when viewed in plan.

17. The device according to claim 6, wherein the second bumps are disposed in a triangular shape when viewed in plan.

18. The device according to claim 14, wherein the active areas are disposed near corners of and/or at a center of the polygonal light emitting device.

19. A light emitting device package, comprising:
a substrate;
a light emitting structure disposed under the substrate, the light emitting structure including a first conductive semiconductor layer, an active layer, and a second conductive semiconductor layer;
a sub-mount;
first metal pads and second metal pads disposed on the sub-mount and configured to be electrically spaced apart from one another;
first bumps disposed between the first conductive semiconductor layer and the first metal pads;
second bumps located between the second conductive semiconductor layer and the second metal pads,
wherein a plurality of active areas in which the first semiconductor layer, the active layer, and the first bumps are disposed are spaced apart from one another when viewed in plan, and
wherein, the second bumps are not disposed in the active areas, the first bumps disposed in the active areas are spaced apart from one another when viewed in plan, and each of the second bumps is disposed between the first bumps when viewed in plan;
a header;
a sidewall disposed on the header to define a cavity;
first and second wires configured to be respectively electrically connected to the first and second metal pads, the light emitting device being disposed in the cavity on the header;
first and second lead wires configured to be electrically connected to the first and second metal pads via the first and second wires, respectively; and
a molding member formed to fill the cavity so as to enclose the light emitting device.

20. A lighting apparatus, comprising:
a light emitting device package comprising:
a substrate;
a light emitting structure disposed under the substrate, the light emitting structure including a first conductive semiconductor layer, an active layer, and a second conductive semiconductor layer;
a sub-mount;
first metal pads and second metal pads disposed on the sub-mount and configured to be electrically spaced apart from one another;
first bumps disposed between the first conductive semiconductor layer and the first metal pads;
second bumps located between the second conductive semiconductor layer and the second metal pads,
wherein a plurality of active areas in which the first semiconductor layer, the active layer, and the first bumps are disposed are spaced apart from one another when viewed in plan, and
wherein the second bumps are not disposed in the active areas, the first bumps disposed in the active areas are spaced apart from one another when viewed in plan, and each of the second bumps is disposed between the first bumps when viewed in plan;
a header;
a sidewall disposed on the header to define a cavity;

first and second wires configured to be respectively electrically connected to the first and second metal pads, the light emitting device being disposed in the cavity on the header;

first and second lead wires configured to be electrically connected to the first and second metal pads via the first and second wires, respectively; and a molding member formed to fill the cavity so as to enclose the light emitting device; and a cover configured to diffuse, scatter or excite light emitted from the light emitting device package.

* * * * *